US011228281B2

(12) United States Patent
Chang et al.

(10) Patent No.: US 11,228,281 B2
(45) Date of Patent: Jan. 18, 2022

(54) APPARATUS AND METHOD FOR CALIBRATING CHARACTERISTICS OF POWER AMPLIFIER IN TRANSMITTER

(71) Applicant: MEDIATEK INC., Hsin-Chu (TW)

(72) Inventors: Yu-Hsien Chang, Hsin-Chu (TW);
Yu-Ming Lai, Hsin-Chu (TW);
Ching-Chia Cheng, Hsinchu (TW);
Wei-Kai Hong, Hsinchu (TW); Yi-Chu Chen, Hsinchu (TW); Tsung-Ming Chen, Hsinchu (TW); Shih-Chieh Yen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 106 days.

(21) Appl. No.: 16/439,713

(22) Filed: Jun. 13, 2019

(65) Prior Publication Data
US 2020/0028469 A1    Jan. 23, 2020

Related U.S. Application Data

(60) Provisional application No. 62/699,011, filed on Jul. 17, 2018.

(51) Int. Cl.
*H03F 1/32* (2006.01)
*H03F 1/02* (2006.01)
*H03F 3/193* (2006.01)
*H03F 3/21* (2006.01)

(52) U.S. Cl.
CPC ......... *H03F 1/0205* (2013.01); *H03F 1/3241* (2013.01); *H03F 1/3247* (2013.01); *H03F 3/193* (2013.01); *H03F 3/21* (2013.01)

(58) Field of Classification Search
CPC ...... H03F 1/0205; H03F 1/3247; H03F 3/193; H03F 3/21; H03F 2203/45048; H03F 2200/411; H03F 2200/75; H03F 3/45179; H03F 3/45475; H03F 1/301; H03F 2200/451; H03F 1/0266; H03F 1/0272; H03F 2200/387; H03F 2200/537; H03F 2200/09; H03F 3/245; H03F 1/3205; H03F 1/3211; H03F 1/0211; H04B 17/13
USPC ........ 330/277, 149, 251–261, 188, 195, 165
See application file for complete search history.

(56) References Cited

U.S. PATENT DOCUMENTS

| 9,231,531 | B2 | 1/2016 | Tsai |
| 9,985,590 | B2 | 5/2018 | Tseng |
| 2008/0095264 | A1 | 4/2008 | Deng |
| 2015/0162882 | A1 | 6/2015 | Tam |
| 2015/0288338 | A1 | 10/2015 | Liu |
| 2018/0123538 | A1 | 5/2018 | Chen |

FOREIGN PATENT DOCUMENTS

JP    4498189 B2    7/2010

*Primary Examiner* — Khanh V Nguyen
*Assistant Examiner* — Khiem D Nguyen
(74) *Attorney, Agent, or Firm* — Winston Hsu

(57) ABSTRACT

A calibration apparatus is used for calibrating characteristics of a power amplifier (PA) in a transmitter. The calibration apparatus includes an adaptive bias generator circuit that is used to track an envelope of an input signal received by control terminals of transistors of the PA and generate an adaptive bias voltage to the control terminals of the input transistors in response to the envelope of the input signal.

16 Claims, 6 Drawing Sheets

APPARATUS AND METHOD FOR CALIBRATING CHARACTERISTICS OF POWER AMPLIFIER IN TRANSMITTER

CROSS REFERENCE TO RELATED APPLICATIONS

This application claims the benefit of U.S. provisional application No. 62/699,011, filed on Jul. 17, 2018 and incorporated herein by reference.

BACKGROUND

The present invention relates to a communication system, and more particularly, to an apparatus and method for calibrating characteristics of a power amplifier in a transmitter.

High efficiency and linearity are indispensable requirements of power amplifiers (PAs). Unfortunately, they are difficult to obtain simultaneously, since high efficiency PAs are nonlinear and linear PAs may have low efficiency. In order to satisfy the efficiency and linearity requirements, circuit designers may prioritize the efficiency of PAs in the design process and to later recover the linearity using linearization techniques. Among the linearization techniques, digital pre-distortion (DPD) has drawn the most attention because it can provide a good compromise between linearity performance and implementation complexity.

However, PA characteristic may be out of DPD compensation range due to Voltage Standing Wave Ratio (VSWR) and process variation. It will degrade transmitter's maximum achievable output power seriously. Moreover, PA damage may happen if the user improperly operates the DPD. Thus, there is a need for an innovative calibration design of a PA that is capable of mitigating the VSWR and process variation and/or avoiding the PA damage.

SUMMARY

One of the objectives of the claimed invention is to provide an apparatus and method for calibrating characteristics of a power amplifier in a transmitter.

According to a first aspect of the present invention, an exemplary calibration apparatus for calibrating characteristics of a power amplifier (PA) in a transmitter is disclosed. The exemplary calibration apparatus includes an adaptive bias generator circuit. The adaptive bias generator circuit is arranged to track an envelope of an input signal received by control terminals of transistors of the PA, and generate an adaptive bias voltage to the control terminals of the input transistors in response to the envelope of the input signal.

According to a second aspect of the present invention, an exemplary calibration method for calibrating characteristics of a power amplifier (PA) in a transmitter is disclosed. The exemplary calibration method includes tracking an envelope of an input signal received by control terminals of transistors of the PA, and generating an adaptive bias voltage to the control terminals of the input transistors in response to the envelope of the input signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
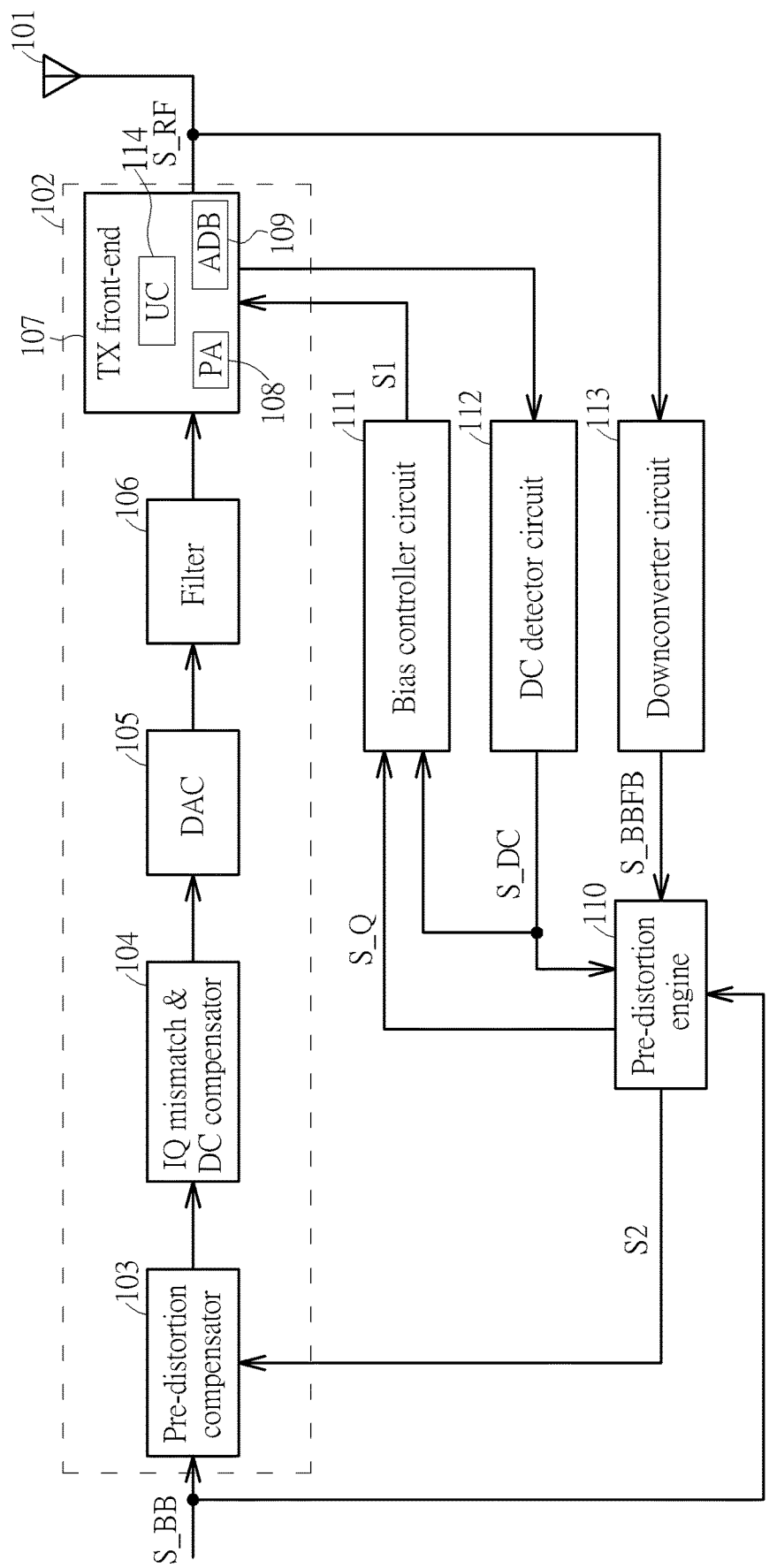
FIG. 1 is a diagram illustrating a communication system according to an embodiment of the present invention.

FIG. 1 is a diagram illustrating a communication system according to an embodiment of the present invention. The communication system 100 includes a transmitter 102 that receives a baseband signal S_BB and converts the baseband signal S_BB into a radio-frequency (RF) signal S_RF for radio transmission via an antenna 101. For example, the transmitter 102 may have a plurality of circuits, including a pre-distortion compensator 103, an in-phase/quadrature (IQ) mismatch & direct current (DC) compensator 104, a digital-to-analog converter (DAC) 105, a filter 106, and a transmit (TX) front-end 107. The TX front-end 107 includes a power amplifier (denoted by "PA") 108, an adaptive bias generator circuit (denoted by "ADB") 109, an up-converter circuit (denoted by "UC") 114, and other circuits (not shown). The up-converter circuit 114 is used to perform up-conversion from baseband to RF. In addition, a calibration apparatus is implemented in the communication system 100, and is used for calibrating characteristics of the power amplifier 108 in the transmitter 102. In this embodiment, the calibration apparatus may have a plurality of circuits, including the adaptive bias generator circuit 109 (which is also a part of the transmitter 102), a pre-distortion engine 110, a bias controller circuit 111, a DC detector circuit 112, and a downconverter circuit 113.

The adaptive bias generator circuit 109 is arranged to generate an adaptive bias voltage to the power amplifier 108. The bias controller circuit 111 is arranged to generate a bias control signal S1 for controlling the adaptive bias voltage provided by the adaptive bias generator circuit 109 and for setting a constant bias voltage to the power amplifier 108.

The DC detector circuit 112 is arranged to monitor a DC level associated with an output signal of the PA 108, generate a feedback DC signal S_DC indicative of the DC level, and output the feedback DC signal S_DC to the bias controller circuit 111. The downconverter circuit 113 is arranged to generate a feedback baseband signal S_BBFB according to the output signal of the PA, and output the feedback baseband signal S_BBFB to the pre-distortion engine 110. The pre-distortion compensator 103 is a digital pre-distortion (DPD) circuit used to compensate for nonlinearity of the power amplifier 108, and is controlled by a pre-distortion control signal S2 generated from the pre-distortion engine 110. Some hardware components of the pre-distortion engine 110 may be reused to generate a quality index signal S_Q to the bias controller circuit 111. Further details of the proposed calibration apparatus are described with reference to the accompanying drawings.

Figure 2:
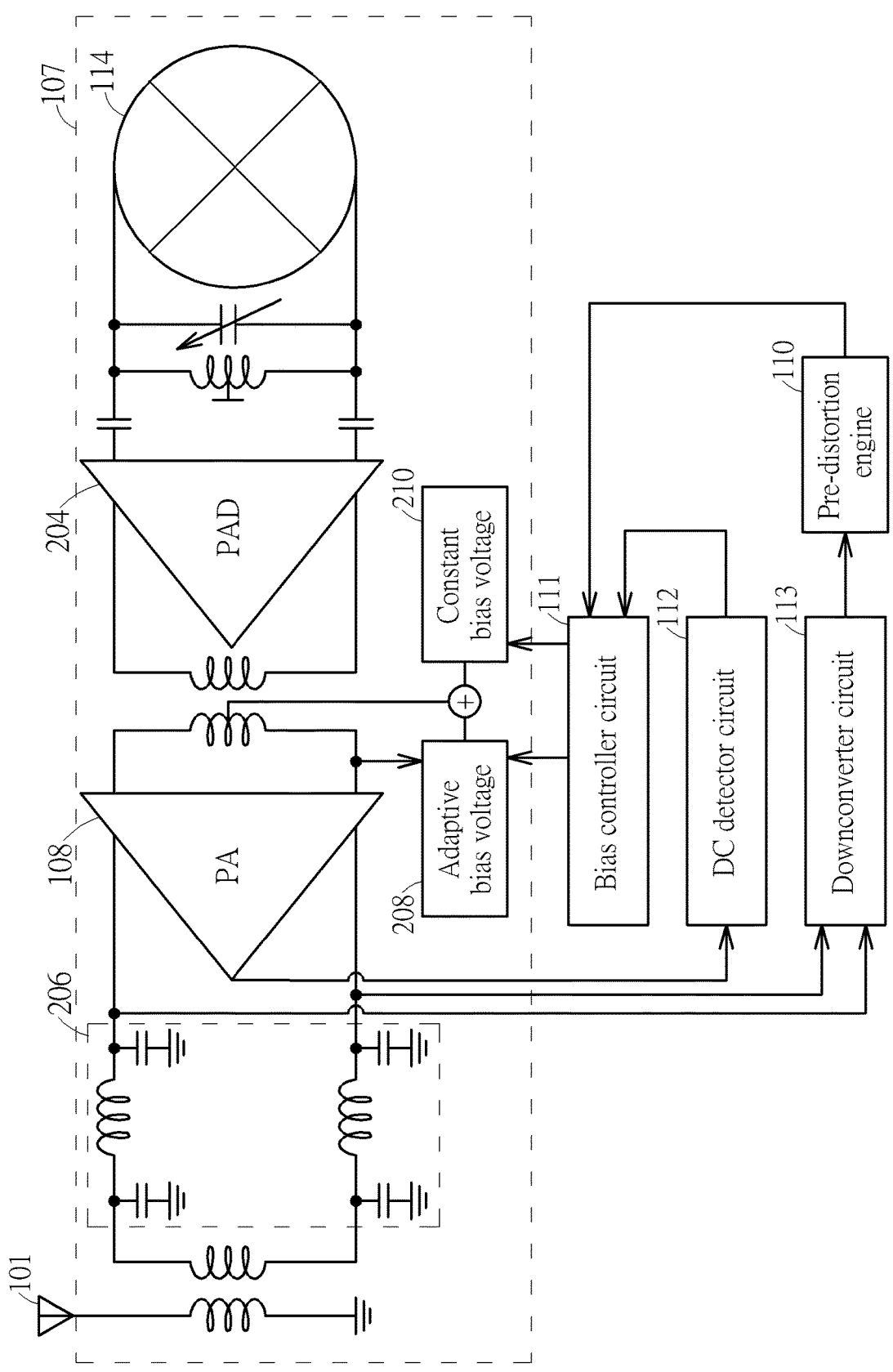
FIG. 2 is a diagram illustrating an exemplary circuit structure of a TX front-end shown in FIG. 1.

FIG. 2 is a diagram illustrating an exemplary circuit structure of the TX front-end 107 shown in FIG. 1. The TX front-end 107 may include a power amplifier driver (denoted by "PAD") 204, a matching network 206, and the aforementioned power amplifier (denoted by "PA") 108 and up-converter circuit 114. The adaptive bias voltage 208 applied to the power amplifier 108 is adaptively adjusted by the adaptive bias generator circuit 109, and the configuration of the adaptive bias generator circuit 109 is controlled by the bias controller circuit 111. The constant bias voltage 210 applied to the power amplifier 108 is determined by the bias controller circuit 111.

Figure 3:
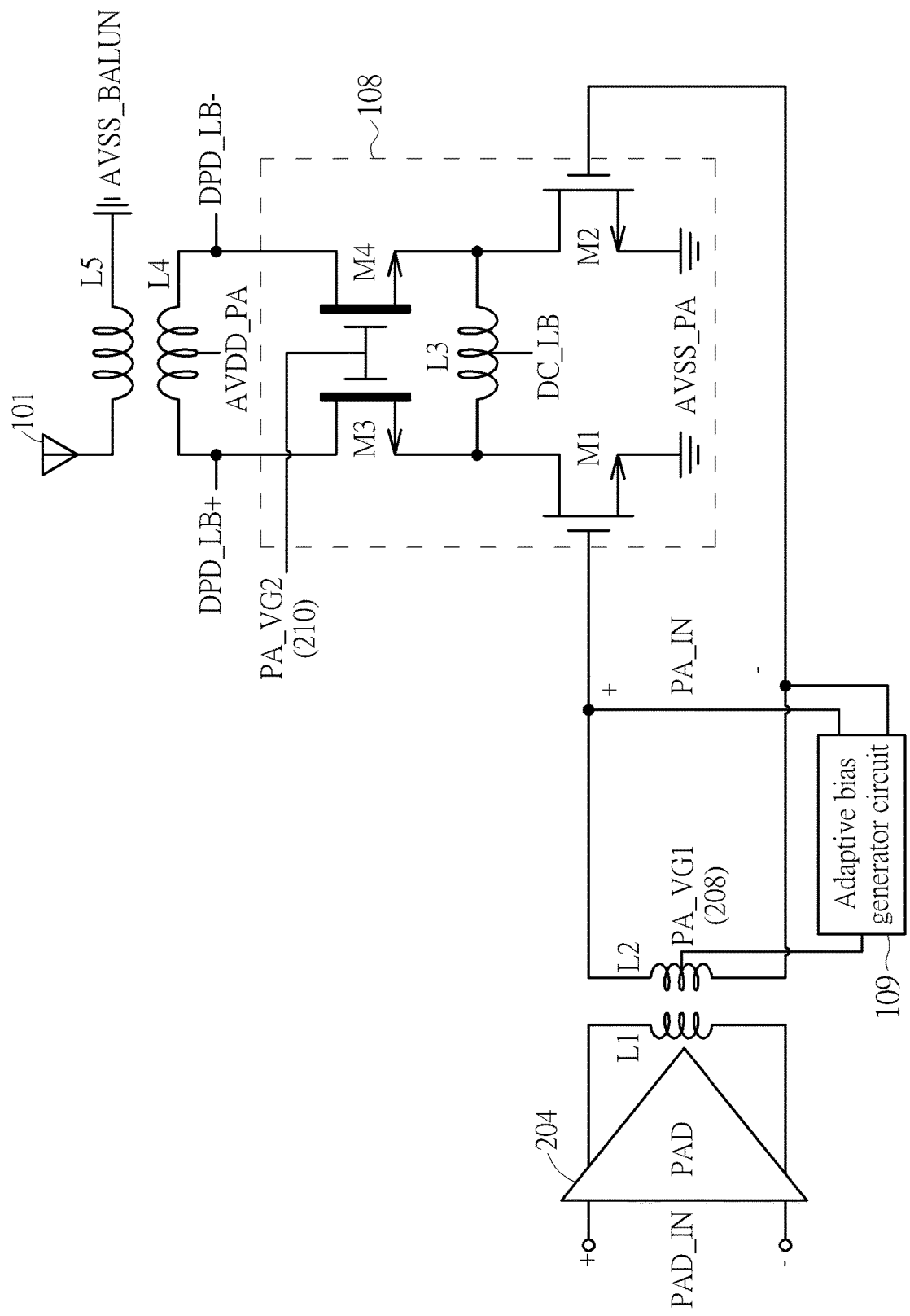
FIG. 3 is a diagram illustrating an exemplary circuit structure of a power amplifier shown in FIG. 1/FIG. 2.

FIG. 3 is a diagram illustrating an exemplary circuit structure of the power amplifier 108 shown in FIG. 1/FIG. 2. In this example, the power amplifier 108 is implemented by a cascode amplifier having a first stage and a second stage, where the first stage includes a pair of input transistors M1 and M2, and the second stage includes a pair of output transistors M3 and M4. For example, the input transistors M1 and M2 and the output transistors M3 and M4 are n-channel metal-oxide-semiconductor field-effect transistors (NMOS transistors). An input signal PAD_IN of the power amplifier driver (PAD) 204 is transferred into an input signal PA_IN of the power amplifier 108 through a transformer consisting of inductors L1 and L2. A center tap of the inductor L2 is connected to an adaptive bias voltage (denoted by "PA_VG1") 208, such that the same adaptive bias voltage PA_VG1 is applied to control terminals (e.g., gate terminals) of the input transistors M1 and M2.

The adaptive bias generator circuit 109 is arranged to track an envelope of the input signal PA_IN received by the control terminals (e.g., gate terminals) of the input transistors M1 and M2, and generate the adaptive bias voltage PA_VG1 to the control terminals (e.g., gate terminals) of the input transistors M1 and M2 in response to the envelop of the input signal PA_IN. In other words, the adaptive bias voltage PA_VG1 is adaptively adjusted according to variation of the envelope of the input signal PA_IN.

Figure 4:
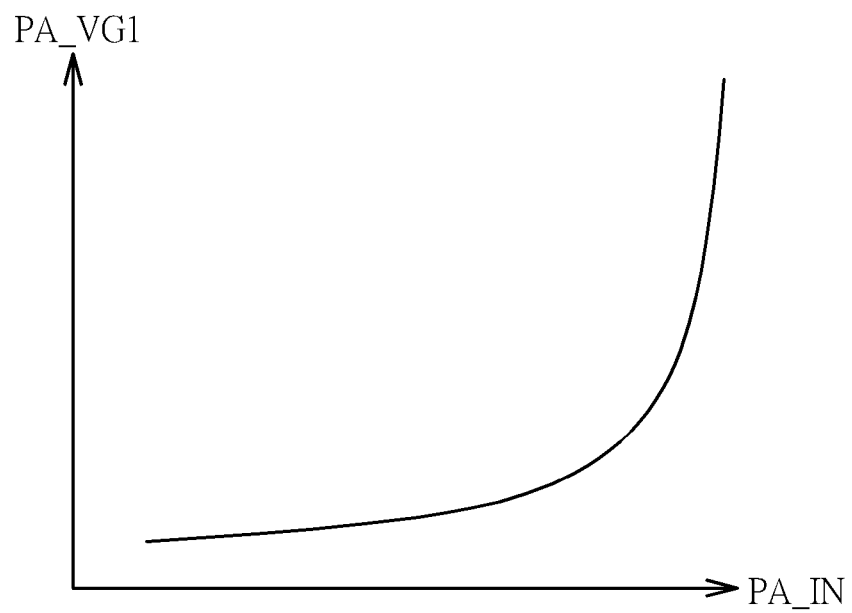
FIG. 4 is a diagram illustrating a positive correlation between an adaptive bias voltage of a power amplifier and an envelope of an input signal of the power amplifier.
Figure 5:
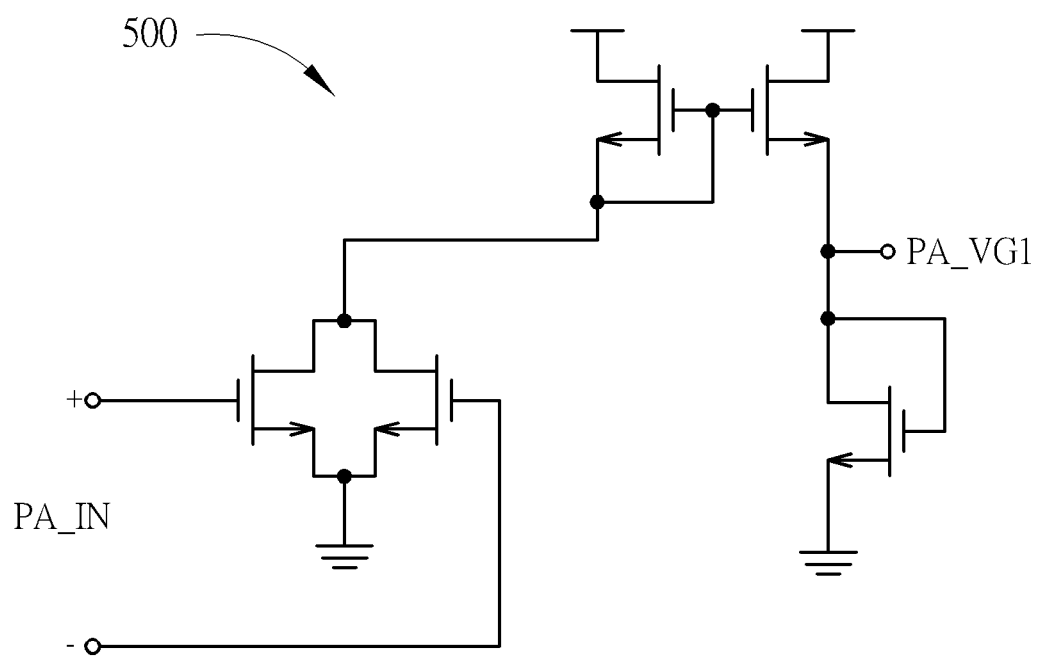
FIG. 5 is a diagram illustrating a first adaptive bias generator circuit according to an embodiment of the present invention.

In one exemplary design, the adaptive bias voltage PA_VG1 is positively correlated with the envelope of the input signal PA_IN, as illustrated in FIG. 4. Hence, the adaptive bias voltage PA_VG1 has a higher voltage level when the input signal PA_IN has a larger envelope, and the adaptive bias voltage PA_VG1 has a lower voltage level when the input signal PA_IN has a smaller envelope. FIG. 5 is a diagram illustrating a first adaptive bias generator circuit according to an embodiment of the present invention. The adaptive bias generator circuit 109 shown in FIG. 3 may be implemented using the adaptive bias generator circuit 500 that is designed for generating the adaptive bias voltage PA_VG1 positively correlated with the envelope of the input signal PA_IN.

Figure 6:
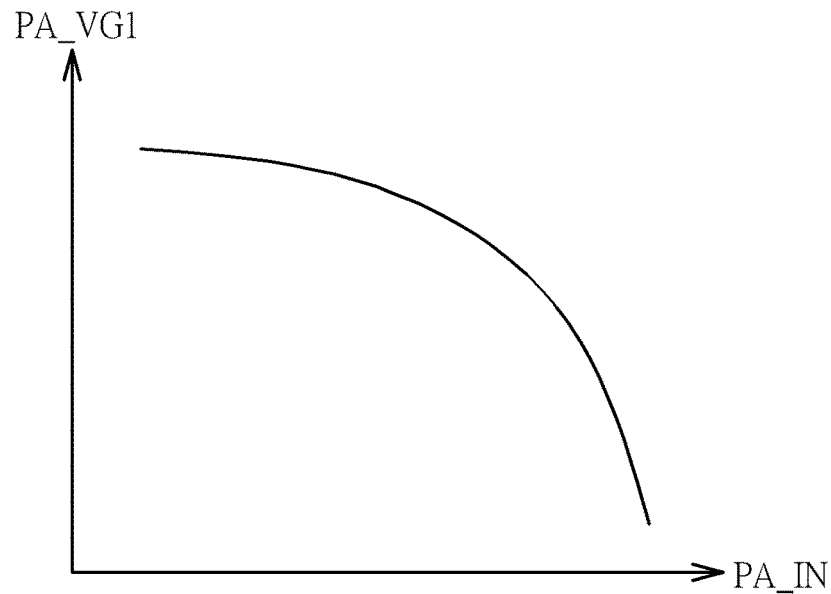
FIG. 6 is a diagram illustrating a negative correlation between an adaptive bias voltage of a power amplifier and an envelope of an e input signal of the power amplifier.
Figure 7:
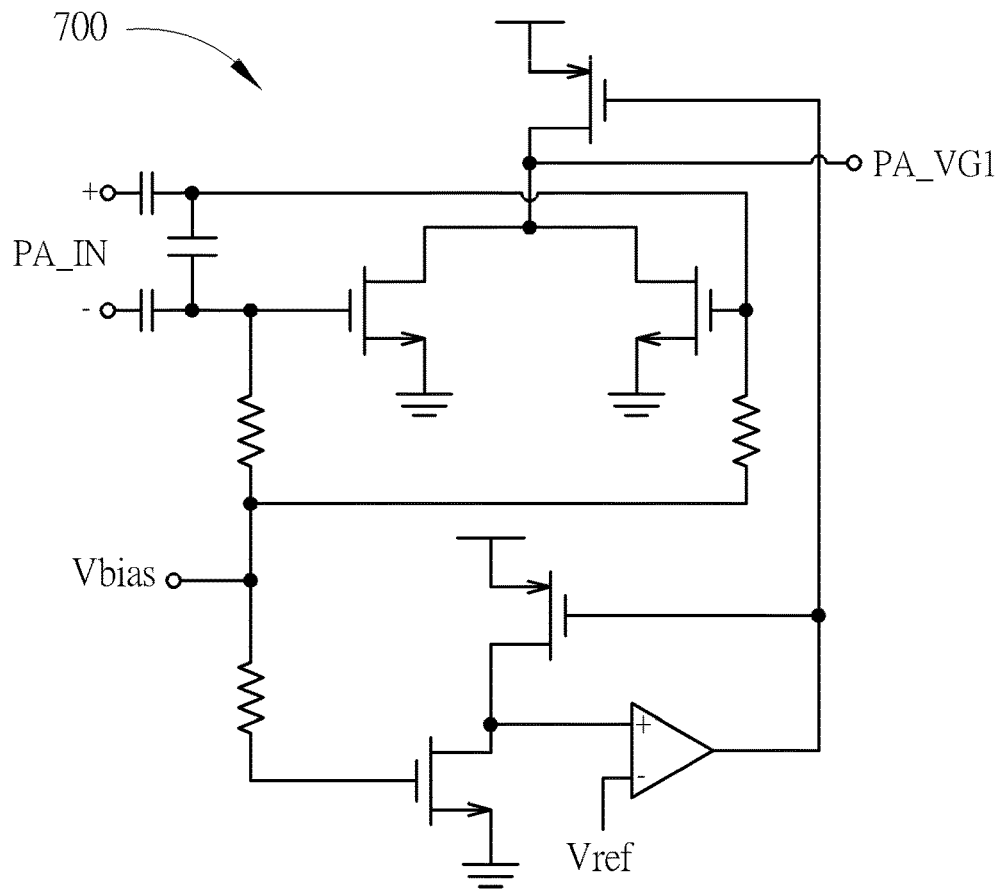
FIG. 7 is a diagram illustrating a second adaptive bias generator circuit according to an embodiment of the present invention.

In another exemplary design, the adaptive bias voltage PA_VG1 is negatively correlated with the envelope of the input signal PA_IN, as illustrated in FIG. 6. Hence, the adaptive bias voltage PA_VG1 has a higher voltage level when the input signal PA_IN has a smaller envelope, and the adaptive bias voltage PA_VG1 has a lower voltage level when the input signal PA_IN has a larger envelope. FIG. 7 is a diagram illustrating a second adaptive bias generator circuit according to an embodiment of the present invention. The adaptive bias generator circuit 109 shown in FIG. 3 may be implemented using the adaptive bias generator circuit 700 that is designed for generating the adaptive bias voltage PA_VG1 negatively correlated with the envelope of the input signal PA_IN.

It should be noted that the adaptive bias generator circuit 109 may be implemented using one of the adaptive bias generator circuits 500 and 700, depending upon the actual bias considerations. Since the adaptive bias voltage PA_VG1 is adaptively adjusted, the adaptive bias generator circuit 109 is capable of compensating for the VSWR and process variation. In this way, the PA characteristic can be within digital pre-distortion compensation range, thereby maintaining the transmitter maximum achievable output power.

As shown in FIG. 3, an inductor L3 is coupled between first connection terminals (e.g., drain terminals) of the input transistors M1 and M2, and is also coupled between second connection terminals (e.g., source terminals) of the output transistors M3 and M4. In addition, second connection terminals (e.g., source terminals) of the input transistors M1 and M2 are coupled to a ground voltage AVSS_PA. The output signal {DPD_LB+, DPD_LB−} of the power amplifier 108 is a differential signal, and is converted into a single-ended signal through a balun (balanced to unbalanced) having two inductors L4 and L5. One end of the inductor L5 is coupled to the antenna 101, and another end of the inductor L5 is coupled to a ground voltage AVSS_BALUN. The inductor L4 is coupled between first connection terminals (e.g., drain terminals) of the output transistors M3 and M4, where a center tap of the inductor L4 is connected to a supply voltage AVDD_PA. In addition, a constant bias voltage (denoted by "PA_VG2") 210 is a cascode gate bias supplied to control terminals (e.g., gate terminals) of the output transistors M3 and M4.

Figure 8:
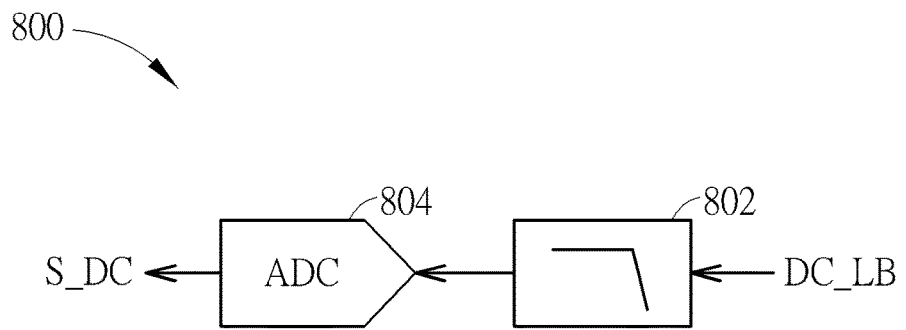
FIG. 8 is a diagram illustrating a DC detector circuit according to an embodiment of the present invention.

A center tap of the inductor L3 provides a DC level (e.g., cascode DC level) DC_LB associated with the output signal {DPD_LB+, DPD_LB−} of the power amplifier 108. The DC detector circuit 112 shown in FIG. 1/FIG. 2 is arranged to monitor the DC level DC_LB and generate a feedback DC signal S_DC indicative of the DC level DC_LB. FIG. 8 is a diagram illustrating a DC detector circuit according to an embodiment of the present invention. The DC detector circuit 112 shown in FIG. 1/FIG. 2 may be implemented using the DC detector circuit 800. The DC detector circuit 800 includes a filter (e.g., low-pass filter) 802 and an analog-to-digital converter (ADC) 804. The DC level DC_LB is fed into the filter 802, and the ADC 804 converts an analog output of the filter 802 into the feedback DC signal S_DC that is a digital signal. The bias controller circuit 111 monitors the feedback DC signal S_DC to determine if the saturated power Psat of the power amplifier 108 is optimum. When the saturated power Psat of the power amplifier 108 is not optimum, the bias controller circuit 111 is operative to calibrate the constant bias voltage PA_VG2 that is supplied to the control terminals (e.g., gate terminals) of the output transistors M3 and M4.

Figure 9:
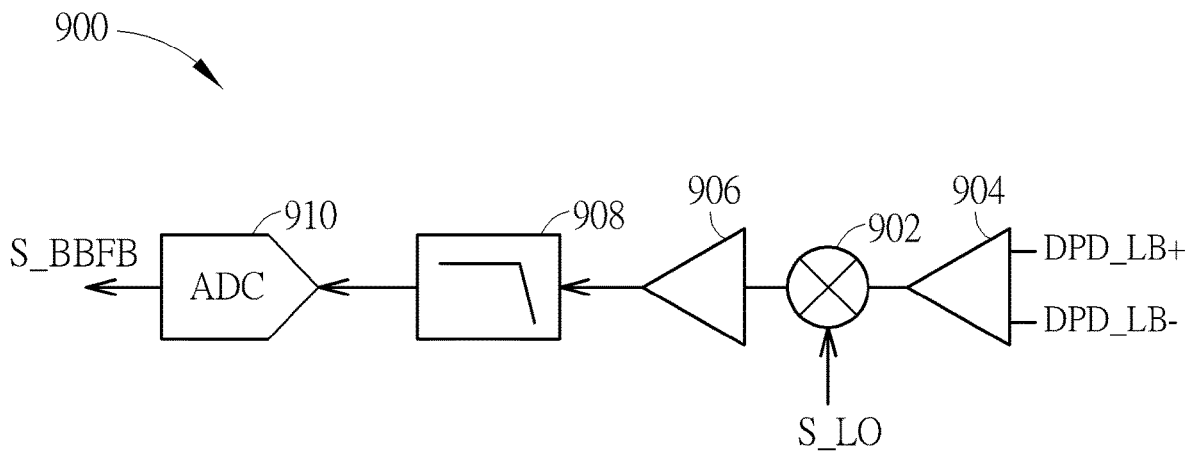
FIG. 9 is a diagram illustrating a downconverter circuit according to an embodiment of the present invention.

The output signal {DPD_LB+, DPD_LB−} of the power amplifier 108 may also serve as a feedback RF signal. Hence, the downconverter circuit 113 shown in FIG. 1/FIG. 2 is arranged to generate a feedback baseband signal S_BBFB according to the output signal {DPD_LB+, DPD_LB−} of the power amplifier 108. FIG. 9 is a diagram illustrating a downconverter circuit according to an embodiment of the present invention. The downconverter circuit 113 shown in FIG. 1/FIG. 2 may be implemented using the downconverter circuit 900. The downconverter circuit 900 includes a mixer 902, a plurality of amplifiers 904, 906, a filter (e.g., low-pass filter) 908, and an analog-to-digital converter (ADC) 910. The amplifier 904 receives the output signal {DPD_LB+, DPD_LB−}, and generates an amplifier output to the mixer 902. The mixer 902 mixes the amplifier output of the amplifier 904 with a local oscillator (LO) signal S_LO to generate a mixer output. The amplifier 906 receives the mixer output, and generates an amplifier output to the filter 908. The ADC 910 is arranged to convert an analog baseband signal generated from the filter 908 into the feedback baseband signal S_BBFB that is a digital signal.

The pre-distortion engine 110 is a digital processing circuit that is capable of generating the quality index signal S_Q by estimating AM-AM distortion and/or AM-PM distortion according to the feedback baseband signal S_BBFB. The bias controller circuit 111 is arranged to configure the adaptive bias generator circuit 109 and/or calibrate the constant bias voltage PA_VG2 according to the quality index signal S_Q. For example, the bias controller circuit 111 configures the adaptive bias generator circuit 109 to set a mapping relation between the adaptive bias voltage PA_VG1 and the envelope of the input signal PA_IN.

The constant bias voltage PA_VG2 dominates the DPD performance. In a case where both of the adaptive bias voltage PA_VG1 and the constant bias voltage PA_VG2 need calibration, the bias controller circuit 111 may first tune the constant bias voltage PA_VG2 and then tune the adaptive bias voltage PA_VG1. However, this is for illustrative purposes only, and is not meant to be a limitation of the present invention.

As mentioned above, PA damage may happen if the user improperly operates the digital pre-distortion. To address this issue, the proposed calibration apparatus may further support a PA damage protection function. For example, the pre-distortion engine 110 is further arranged to compare the feedback DC signal S_DC with a predetermined threshold to generate a comparison result, and selectively pause baseband signal S_BB or DPD calibration program. For another example, the pre-distortion engine 110 is further arranged to compare the feedback baseband signal S_BBFB with a predetermined threshold to generate a comparison result, and selectively pause baseband signal S_BB or DPD calibration program.

The PA damage protection function is used to protect the PA from overload damage. Hence, when the comparison result indicates that the PA output power is close to or above an acceptable power level, the digital pre-distortion calibration is paused to avoid possible PA damage. Furthermore, when baseband signal S_BB or DPD calibration program is paused by the PA damage protection function, a reminder may be sent to notify the user.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A calibration apparatus for calibrating characteristics of a power amplifier (PA) in a transmitter comprising:
    an adaptive bias generator circuit, arranged to track an envelope of an input signal received by control terminals of input transistors of the PA and generate an adaptive bias voltage to the control terminals of the input transistors in response to the envelope of the input signal;
    a bias controller circuit;
    a downconverter circuit, arranged to generate a feedback baseband signal according to an output signal of the PA;
    a processing circuit, arranged to generate a quality index signal according to the feedback baseband signal, and output the quality index signal to the bias controller circuit;
    wherein the bias controller circuit controls a setting of the adaptive bias voltage according to the quality index signal.

2. The calibration apparatus of claim 1, wherein the adaptive bias voltage is positively correlated with the envelope of the input signal.

3. The calibration apparatus of claim 1, wherein the adaptive bias voltage is negatively correlated with the envelope of the input signal.

4. The calibration apparatus of claim 1, wherein the bias controller circuit is further arranged to generate a bias voltage to control terminals of output transistors of the PA.

5. The calibration apparatus of claim 4, further comprising:
    a direct current (DC) detector circuit, arranged to monitor a DC level associated with an output signal of the PA, generate a feedback DC signal indicative of the DC level, and output the feedback DC signal to the bias controller circuit;
    wherein the bias controller circuit generates the bias voltage according to the feedback DC signal.

6. The calibration apparatus of claim 5,
    wherein the bias controller circuit generates the bias voltage according to the quality index signal.

7. A calibration apparatus for calibrating characteristics of a power amplifier (PA) in a transmitter comprising:
    an adaptive bias generator circuit, arranged to track an envelope of an input signal received by control terminals of input transistors of the PA and generate an adaptive bias voltage to the control terminals of the input transistors in response to the envelope of the input signal;
    a direct current (DC) detector circuit, arranged to monitor a DC level associated with an output signal of the PA, and generate a feedback DC signal indicative of the DC level; and
    a processing circuit, arranged to compare the feedback DC signal with a predetermined threshold to generate a comparison result, and selectively pause a digital pre-distortion (DPD) circuit of the transmitter according to the comparison result.

8. A calibration apparatus for calibrating characteristics of a power amplifier (PA) in a transmitter comprising:
    an adaptive bias generator circuit, arranged to track an envelope of an input signal received by control terminals of input transistors of the PA and generate an adaptive bias voltage to the control terminals of the input transistors in response to the envelope of the input signal;

a downconverter circuit, arranged to generate a feedback baseband signal according to an output signal of the PA; and a processing circuit, arranged to compare the feedback baseband signal with a predetermined threshold to generate a comparison result, and selectively pause a digital pre-distortion (DPD) circuit of the transmitter according to the comparison result.

9. A calibration method for calibrating characteristics of a power amplifier (PA) in a transmitter comprising:

tracking an envelope of an input signal received by control terminals of input transistors of the PA;

generating an adaptive bias voltage to the control terminals of the input transistors in response to the envelope of the input signal;

generating a feedback baseband signal according to an output signal of the PA;

generating a quality index signal according to the feedback baseband signal; and controlling a setting of the adaptive bias voltage according to the quality index signal.

10. The calibration method of claim 9, wherein the adaptive bias voltage is positively correlated with the envelope of the input signal.

11. The calibration method of claim 9, wherein the adaptive bias voltage is negatively correlated with the envelope of the input signal.

12. The calibration method of claim 9, further comprising:

generating a bias voltage to control terminals of output transistors of the PA.

13. The calibration method of claim 12, wherein generating the bias voltage comprises:

monitoring a direct current (DC) level associated with an output signal of the PA;

generating a feedback DC signal indicative of the DC level; and generating the bias voltage according to the feedback DC signal.

14. The calibration method of claim 12, wherein generating the bias voltage comprises:

generating the bias voltage according to the quality index signal.

15. A calibration method for calibrating characteristics of a power amplifier (PA) in a transmitter comprising:

tracking an envelope of an input signal received by control terminals of input transistors of the PA;

generating an adaptive bias voltage to the control terminals of the input transistors in response to the envelope of the input signal;

monitoring a direct current (DC) level associated with an output signal of the PA;

generating a feedback DC signal indicative of the DC level;

comparing the feedback DC signal with a predetermined threshold to generate a comparison result; and selectively pausing a digital pre-distortion (DPD) circuit of the transmitter according to the comparison result.

16. A calibration method for calibrating characteristics of a power amplifier (PA) in a transmitter comprising:

tracking an envelope of an input signal received by control terminals of input transistors of the PA;

generating an adaptive bias voltage to the control terminals of the input transistors in response to the envelope of the input signal;

generating a feedback baseband signal according to an output signal of the PA;

comparing the feedback baseband signal with a predetermined threshold to generate a comparison result; and selectively pausing a digital pre-distortion (DPD) circuit of the transmitter according to the comparison result.

* * * * *